US008365051B2

(12) United States Patent
Chun et al.

(10) Patent No.: US 8,365,051 B2
(45) Date of Patent: Jan. 29, 2013

(54) DEVICE, SYSTEM AND METHOD OF DECODING WIRELESS TRANSMISSIONS

(75) Inventors: Anthony L. Chun, Los Altos, CA (US); Jenny Chang, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 375 days.

(21) Appl. No.: 12/773,050

(22) Filed: May 4, 2010

(65) Prior Publication Data
US 2011/0276861 A1 Nov. 10, 2011

(51) Int. Cl.
*H03M 13/00* (2006.01)
(52) U.S. Cl. ........ 714/780; 714/755; 714/792; 714/745; 714/774; 714/768
(58) Field of Classification Search ........................ None
See application file for complete search history.

(56) References Cited

U.S. PATENT DOCUMENTS

| | | | | |
|---|---|---|---|---|
| 2002/0147954 A1* | 10/2002 | Shea | ............................ | 714/755 |
| 2004/0225949 A1* | 11/2004 | Coombs et al. | ............... | 714/796 |
| 2006/0156171 A1* | 7/2006 | Kuznetsov et al. | ............ | 714/755 |
| 2009/0094503 A1* | 4/2009 | Shin et al. | ...................... | 714/755 |
| 2009/0138668 A1* | 5/2009 | Blankenship | .................. | 711/157 |
| 2009/0300463 A1* | 12/2009 | Purkovic et al. | .............. | 714/755 |
| 2010/0064197 A1* | 3/2010 | Halter | ............................ | 714/755 |
| 2010/0091913 A1* | 4/2010 | Kim et al. | ...................... | 375/341 |

OTHER PUBLICATIONS

M. C. Valenti and J. Sun, "The UMTS Turbo Code and an Efficient Decoder Implementation Suitable for Software-Defined Radios", International Journal of Wireless Information Networks, vol. 8, No. 4, Oct. 2001, pp. 203-215.
IEEE Standard 802.16-2009, Part 16: Air Interface for Fixed Broadband Wireless Access Systems, May 29, 2009 (Revision of IEEE Std 802.16-2004).
Masera et al "VLSI Architectures for Turbo Codes", IEEE T-VLSI Systems, vol. 7, No. 3, pp. 369-379, Sep. 1999.

* cited by examiner

*Primary Examiner* — John Trimmings
(74) *Attorney, Agent, or Firm* — Shichrur & Co.

(57) ABSTRACT

Some demonstrative embodiments include devices, systems and/or methods of turbo decoding. For example, a device may include a turbo decoder to decode a turbo-encoded input according to a turbo code, the turbo-encoded input including a plurality of soft-decision information-bit values and a plurality of soft-decision parity-bit values corresponding to the soft-decision information bit values, wherein the turbo decoder is to output a plurality of extrinsic soft-decision parity-bit values corresponding to the plurality soft-decision parity-bit values. Other embodiments are described and claimed.

18 Claims, 5 Drawing Sheets

DEVICE, SYSTEM AND METHOD OF DECODING WIRELESS TRANSMISSIONS

BACKGROUND

Some wireless communication systems may utilize a suitable recursive systematic code, for example, a suitable Turbo Code (TC), e.g., any suitable Convolutional Turbo Code (CTC), to encode wireless transmissions. The TC may be based, for example, on a suitable trellis diagram. For example, a plurality of information bits (also referred to as "systematic bits") may be encoded using a plurality of parity bits.

A transmitter may include, for example, a convolutional encoder capable of receiving first and second pluralities of information bits, denoted a(k) and b(k), respectively, and generating first and second pluralities of parity bits, denoted $y_1(k)$ and $y_2(k)$, respectively. The transmitter may transmit a wireless transmission representing the information bits a(k) and b(k) and the parity bits $y_1(k)$ and $y_2(k)$.

A receiver may include a turbo decoder capable of decoding the received wireless transmission, and to generate decoded information bits $a_d(k)$ and $b_d(k)$ corresponding to the information bits a(k) and b(k), respectively.

BRIEF DESCRIPTION OF THE DRAWINGS

For simplicity and clarity of illustration, elements shown in the figures have not necessarily been drawn to scale. For example, the dimensions of some of the elements may be exaggerated relative to other elements for clarity of presentation. Furthermore, reference numerals may be repeated among the figures to indicate corresponding or analogous elements. The figures are listed below.

DETAILED DESCRIPTION

In the following detailed description, numerous specific details are set forth in order to provide a thorough understanding of some embodiments. However, it will be understood by persons of ordinary skill in the art that some embodiments may be practiced without these specific details. In other instances, well-known methods, procedures, components, units and/or circuits have not been described in detail so as not to obscure the discussion.

Discussions herein utilizing terms such as, for example, "processing", "computing", "calculating", "determining", "establishing", "analyzing", "checking", or the like, may refer to operation(s) and/or process(es) of a computer, a computing platform, a computing system, or other electronic computing device, that manipulate and/or transform data represented as physical (e.g., electronic) quantities within the computer's registers and/or memories into other data similarly represented as physical quantities within the computer's registers and/or memories or other information storage medium that may store instructions to perform operations and/or processes.

The terms "plurality" and "a plurality" as used herein include, for example, "multiple" or "two or more". For example, "a plurality of items" includes two or more items.

Some embodiments may be used in conjunction with various devices and systems, for example, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless Access Point (AP), a wired or wireless router, a wired or wireless modem, a video device, an audio device, an audio-video (AN) device, a Set-Top-Box (STB), a Blu-ray disc (BD) player, a BD recorder, a Digital Video Disc (DVD) player, a High Definition (HD) DVD player, a DVD recorder, a HD DVD recorder, a Personal Video Recorder (PVR), a broadcast HD receiver, a video source, an audio source, a video sink, an audio sink, a stereo tuner, a broadcast radio receiver, a flat panel display, a Personal Media Player (PMP), a digital video camera (DVC), a digital audio player, a speaker, an audio receiver, an audio amplifier, a gaming device, a data source, a data sink, a Digital Still camera (DSC), a wired or wireless network, a wireless area network, a Wireless Video Area Network (WVAN), a Local Area Network (LAN), a Wireless LAN (WLAN), a Wireless Metropolitan Area Network (WMAN) communication system, a Personal Area Network (PAN), a Wireless PAN (WPAN), devices and/or networks operating in accordance with existing IEEE 802.11 (IEEE 802.11-1999: Wireless LAN Medium Access Control (MAC) and Physical Layer (PHY) Specifications), 802.11a, 802.11b, 802.11g, 802.11h, 802.11j, 802.11n, 802.11 task group ad (TGad) ("the 802.16 standards"), 802.15.3c, 802.16 (IEEE-Std 802.16, 2004 Edition, Air Interface for Fixed Broadband Wireless Access Systems), 802.16d, 802.16e (IEEE-Std 802.16e, 2005 Edition, Physical and Medium Access Control Layers for Combined Fixed and Mobile Operation in Licensed Bands), 802.16f, 802.16m standards ("the 802.16 standards") and/or future versions and/or derivatives thereof, devices and/or networks operating in accordance with existing Wireless-Gigabit-Alliance (WGA) and/or WirelessHD™ specifications and/or future versions and/or derivatives thereof, devices and/or networks operating in accordance with existing cellular specifications and/or protocols, e.g., 3rd Generation Partnership Project (3GPP), 3GPP Long Term Evolution (LTE), and/or future versions and/or derivatives thereof, units and/or devices which are part of the above networks, one way and/or two-way radio communication systems, cellular radio-telephone communication systems, a cellular telephone, a wireless telephone, a Personal Communication Systems (PCS) device, a PDA device which incorporates a wireless communication device, a mobile or portable Global Positioning System (GPS) device, a device which incorporates a GPS receiver or transceiver or chip, a device which incorporates an RFID element or chip, a Multiple Input Multiple Output (MIMO) transceiver or device, a device having one or more internal antennas and/or external antennas, Digital Video Broadcast (DVB) devices or systems, multi-standard radio devices or systems, a wired or wireless handheld device (e.g., BlackBerry, Palm Treo), a Wireless Application Protocol (WAP) device, or the like.

Some embodiments may be used in conjunction with one or more types of wireless communication signals and/or systems, for example, Radio Frequency (RF), Infra Red (IR), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), extended GPRS, Code-Division Multiple Access (CDMA), Wideband CDMA (WCDMA), CDMA 2000, single-carrier CDMA, multi-carrier CDMA, Multi-Carrier Modulation (MDM), Discrete Multi-Tone (DMT), Bluetooth®, Global Positioning System (GPS), Wi-Fi, Wi-Max, ZigBee™, Ultra-Wideband (UWB), Global System for Mobile communication (GSM), 2G, 2.5G, 3G, 3.5G, Enhanced Data rates for GSM Evolution (EDGE), or the like. Other embodiments may be used in various other devices, systems and/or networks.

The term "wireless device" as used herein includes, for example, a device capable of wireless communication, a communication device capable of wireless communication, a communication station capable of wireless communication, a portable or non-portable device capable of wireless communication, or the like. In some demonstrative embodiments, a wireless device may be or may include a peripheral that is integrated with a computer, or a peripheral that is attached to a computer. In some demonstrative embodiments, the term "wireless device" may optionally include a wireless service.

Figure 1:
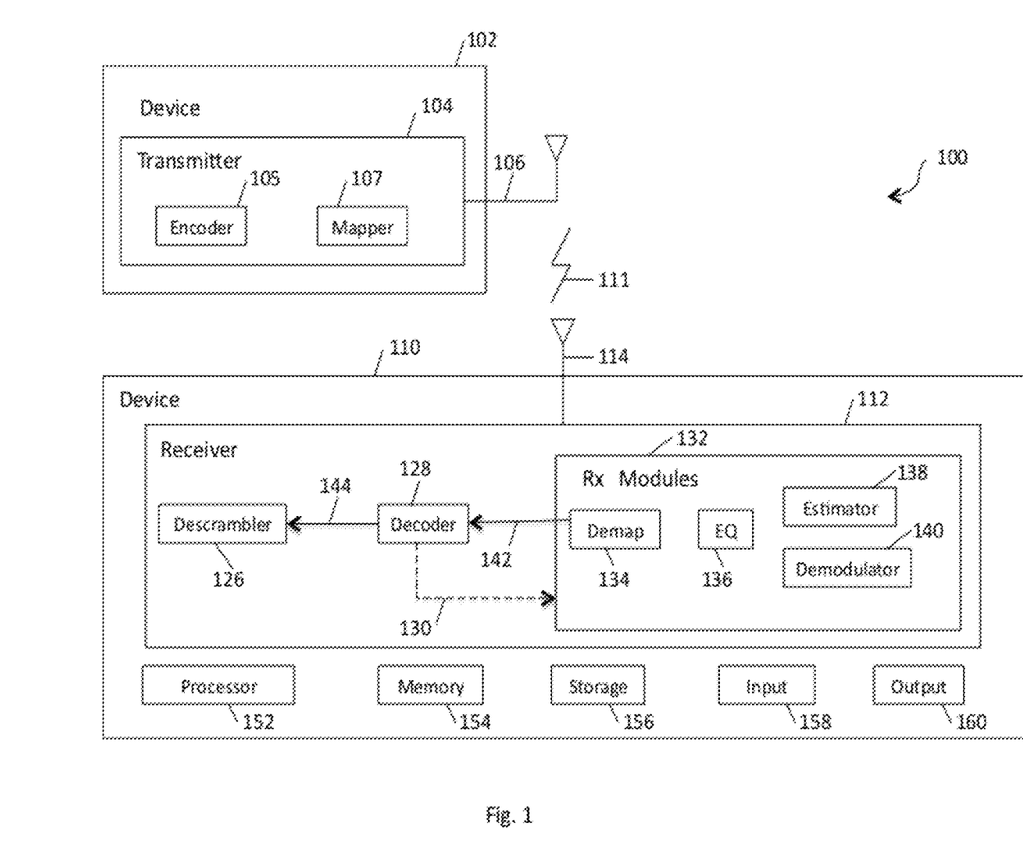
FIG. 1 is a schematic block diagram illustration of a system in accordance with some demonstrative embodiments.

Reference is now made to FIG. 1, which schematically illustrates a block diagram of a system 100 in accordance with some demonstrative embodiments.

As shown in FIG. 1, in some demonstrative embodiments, system 100 may include one or more wireless communication devices, e.g., wireless communication devices 102 and/or 110, capable of communicating content, data, information and/or signals over at least one suitable wireless communication channel 111, for example, a radio channel, an IR channel, a RF channel, a Wireless Fidelity (WiFi) channel, and the like. One or more elements of system 100 may optionally be capable of communicating over any suitable wired communication links.

In some demonstrative embodiments, wireless communication devices 102 and/or 110 may include, for example, a PC, a desktop computer, a mobile computer, a laptop computer, a notebook computer, a tablet computer, a server computer, a handheld computer, a handheld device, a PDA device, a handheld PDA device, an on-board device, an off-board device, a hybrid device (e.g., combining cellular phone functionalities with PDA device functionalities), a consumer device, a vehicular device, a non-vehicular device, a mobile or portable device, a non-mobile or non-portable device, a cellular telephone, a handset, a PCS device, a PDA device which incorporates a wireless communication device, a mobile or portable GPS device, a DVB device, a relatively small computing device, a non-desktop computer, a "Carry Small Live Large" (CSLL) device, an Ultra Mobile Device (UMD), an Ultra Mobile PC (UMPC), a Mobile Internet Device (MID), an "Origami" device or computing device, a device that supports Dynamically Composable Computing (DCC), a context-aware device, a video device, an audio device, an A/V device, a STB, a BD player, a BD recorder, a DVD player, a HD DVD player, a DVD recorder, a HD DVD recorder, a PVR, a broadcast HD receiver, a video source, an audio source, a video sink, an audio sink, a stereo tuner, a broadcast radio receiver, a flat panel display, a PMP, a DVC, a digital audio player, a speaker, an audio receiver, a gaming device, an audio amplifier, a data source, a data sink, a DSC, a media player, a Smartphone, a television, a music player, an AP, a base station, or the like.

In some demonstrative embodiments, communication device 102 may include a transmitter 104 to transmit a wireless transmission to device 110 via one or more antennas 106.

In some demonstrative embodiments, transmitter 104 may encode the wireless transmission according to a suitable recursive systematic code, for example, a suitable Turbo Code (TC), e.g., any suitable Convolutional Turbo Code (CTC). The TC may be based, for example, on any suitable trellis diagram. For example, transmitter 104 may include one or more suitable turbo encoders 105 capable of encoding a plurality of information bits (also referred to as "systematic bits") using a plurality of parity bits, e.g., in accordance with the IEEE 802.16 standards or any other suitable standard. In one example, encoder 105 may include a convolutional encoder capable of receiving first and second pluralities of information bits, denoted a(k) and b(k), respectively, and generating first and second pluralities of parity bits, denoted $y_1(k)$ and $y_2(k)$, respectively. For example, encoder 105 may include a rate 2/4 CTC encoder, e.g., in accordance with the 802.16 standards. The rate 2/4 CTC encoder may include, for example, two rate 2/3 component codes, e.g., according to a suitable trellis diagram, which defines transitions between encoder states.

Transmitter 104 may also include a suitable mapper 107 capable of mapping the information bits a(k) and b(k) and parity bits $y_1(k)$ and $y_2(k)$ to a suitable complex modulation symbol, denoted y(k), e.g., according to any suitable mapping and/or modulation scheme.

In some demonstrative embodiments, transmitter 104 may transmit a wireless transmission representing the symbol y(k), for example, by upconverting the symbol y(k) to a suitable radio frequency.

In some demonstrative embodiments, device 110 may include a receiver 112 to receive the wireless transmission from device 102, e.g., via one or more antennas 114. Types of antennae that may be used for antennas 106 and/or 114 may include but are not limited to internal antenna, dipole antenna, omni-directional antenna, a monopole antenna, an end fed antenna, a circularly polarized antenna, a micro-strip antenna, a diversity antenna and the like.

In some demonstrative embodiments, receiver 112 may include a turbo decoder 128 capable of decoding a turbo-encoded input 142 corresponding to the wireless transmission received from device 102. For example, decoder 128 may decode turbo-encoded input 142 into a decoded output 144 including a plurality of decoded information bits, for example, decoded information bits $a_d(k)$ and $b_d(k)$ corresponding to information bits a(k) and b(k), respectively. Decoded output 144 may be processed, for example, by a suitable descrambler 126.

In some demonstrative embodiments, receiver 112 may include one or more receiver modules 132 capable of providing turbo decoder 128 with turbo-encoded input 142, e.g., as described below.

In some demonstrative embodiments, turbo-encoded input 142 may include a plurality of soft-decision information-bit values, e.g., in the form of first and second pluralities of soft-decision information-bit values, denoted A(k) and B(k), respectively. Soft-decision information-bit values A(k) and/or B(k) may correspond, for example, to information bits a(k) and b(k), respectively. Turbo-encoded input 142 may also include one or more pluralities of soft-decision parity-bit values corresponding to the soft-decision information bit values, for example, first and second pluralities of soft-decision parity-bit values, denoted $Y_1(k)$ and $Y_2(k)$, respectively, corresponding to parity bits $y_1(k)$ and $y_2(k)$, respectively.

In some demonstrative embodiments, receiver modules 132 may include one or more modules capable of mitigating channel impairments such as multipath fading, performing suitable deinterleaving operations, performing suitable Forward Error Correction (FEC), performing suitable descrambling, and/or performing any other suitable operation corresponding to the received wireless transmission. For example, modules 132 may include an equalizer 136, a channel estimator 138, a demodulator 140, a demapper 134 and/or any other suitable module or component capable of processing and/or handling the wireless transmission received via antennas 114. In some embodiments, modules 132 may be implemented by separate and/or independent modules, elements and/or units of receiver 112. In other embodiments, the functionality of two or more receiver modules 132 may be commonly performed by a common module or component. For example, equalizer 136 may perform the functionality of channel estimator 138 and/or demodulator 140.

In some demonstrative embodiments, equalizer 136 may receive an input including complex noisy and/or distorted channel symbols of the wireless transmission received via antennas 114. For example, the complex symbols, denoted $\hat{y}(k)$, may be represented as follows:

$$\hat{y}(k)=y(k)*h+g(k) \quad (1)$$

wherein h denotes an impulse response of channel 111, and g(k) denotes additive white Gaussian noise.

In some demonstrative embodiments, channel estimator 138 may estimate the channel response h, and equalizer 136 may convolve an equalizer filter, denoted W, with the equalizer input $\hat{y}(k)$ to produce an equalized complex output $y_{eq}(k)$, e.g., as follows:

$$y_{eq}(k)=\hat{y}(k)*W \quad (2)$$

In some demonstrative embodiments, equalizer 136 may be implemented in any suitable form, e.g., in a time domain or a frequency domain of input $\hat{y}(k)$. The equalizer output $y_{eq}(k)$ may correspond, for example, to the modulated symbol y(k), which was transmitted by transmitter 104. Demodulator 140 may demodulate the equalized complex output $y_{eq}(k)$ and/or perform any suitable corrections of frequency and/or timing offsets.

In some demonstrative embodiments, demapper 134 may demap the demodulated output of demodulator 140 to generate turbo-encoded input 142, for example, using a suitable soft bit mapper function M, e.g., such that:

$$\{A(k),B(k),Y1(k),Y2(k)\}=M(y_{eq}(k)) \quad (3)$$

The soft-decision bit values {A(k), B(k), Y1(k), Y2(k)} may be proportional, for example, to the probabilities of the coded bits {a(k), b(k), y1(k), y2(k)}.

In some demonstrative embodiments, turbo decoder 128 may decode turbo-encoded input 142 corresponding to the output of modules 132 and to provide an output 130 including extrinsic soft-decision bit values corresponding to turbo-encoded input 142, e.g., as described in detail below.

The term "extrinsic value" as used herein with reference to a certain value, e.g., a soft-decision parity-bit value or a soft-decision information-bit value, may relate to any suitable probability that a the certain value has a predefined value. For example, the extrinsic value may include a log-likelihood-ratio (LLR) value corresponding to the certain value, or any other suitable type of likelihood-ratio.

In some demonstrative embodiments, an extrinsic soft-decision parity-bit value of the plurality of soft-decision parity-bit values may be proportional to a probability that a respective soft-decision parity-bit value of the plurality of soft-decision parity-bit values has a predefined value. For example, the extrinsic soft-decision parity-bit value may be based on a LLR value corresponding to the respective soft-decision parity-bit value, e.g., as described below. In other embodiments, the extrinsic soft-decision value may include any other suitable type of likelihood-ratio or any other suitable extrinsic soft-decision value or ratio.

In some demonstrative embodiments, turbo decoder 128 may include at least one or soft-input-soft-output (SISO) decoder to decode turbo-encoded input 142 using the plurality of soft-decision parity-bit values, and to generate the plurality of extrinsic soft-decision parity-bit values, e.g., as described below.

In some demonstrative embodiments, output 130 may include a feedback, of the extrinsic soft-decision bit values, to one or more of receiver modules 132, e.g., as described below. For example, the extrinsic soft-decision bit values of output 130 may be fed back to equalizer 136. According to this example, equalizer 132 may adjust one or more equalizer parameters of equalizer 132 based on feedback 130, e.g., as described below. In one example, equalizer 132 may adjust one or more equalizer parameters of equalizer 132, e.g., to compensate for channel impairments, and the like.

In some demonstrative embodiments, turbo decoder 128 may feedback, to equalizer 136, the output 130 including a plurality of extrinsic soft-decision information-bit values corresponding to the soft-decision information-bit values of encoded input 142. For example, output 130 may include extrinsic soft-decision information-bit values, denoted $E_A(k)$ and/or $E_B(k)$, corresponding to the soft-decision information-bit values A(k) and/or B(k), e.g., as described below.

In some demonstrative embodiments, turbo decoder 128 may feedback to equalizer 136 the output 130 including a plurality of extrinsic soft-decision parity-bit values corresponding to the plurality of soft-decision parity-bit values, e.g., as described below. For example, output 130 may include extrinsic soft-decision parity-bit values, denoted $E_{Y1}(k)$ and/or $E_{Y2}(k)$, corresponding to the soft-decision information-bit values Y1(k) and/or Y2(k), e.g., as described below.

In some demonstrative embodiments, the values of the extrinsic soft-decision values $E_A(k)$, $E_B(k)$, $E_{Y1}(k)$ and/or $E_{Y2}(k)$ may be proportional to the log of the probability that the respective values of A(k), B(k), Y1(k) and/or Y2(k) at the time k are equal to 1.

In some demonstrative embodiments, equalizer 136 may utilize output 130 to correct, for example, inaccurate metrics and/or improve the performance of equalizer 136 in a manner, which may improve, for example, the performance of decoder 128. For example, equalizer 136 may adjust one or more parameters of the equalizer filter W based on the feedback of output 130.

In some demonstrative embodiments, equalizer 136 may include a suitable adaptive equalizer capable of adjusting one or more equalizer parameters based on output 130 and/or any other suitable information and/or feedback. For example, equalizer 136 may utilize a suitable adaptation algorithm, for example, a suitable Least Mean Square (LMS) algorithm or the like, in order, for example, to adjust the equalizer filter W, e.g., in order to reduce an error metric, denoted e, as described below. In other embodiments, equalizer may adjust any other suitable equalizer parameters based on output 130 using any suitable algorithm and/or method.

In some demonstrative embodiments, the received symbol ŷ(k) at time n may be represented by a real component, denoted $\hat{y}_R(k)$ and an imaginary component, denoted $\hat{y}_I(k)$, for example, as follows:

$$\hat{y}(k)=\hat{y}_R(k)+j\hat{y}_I(k) \tag{4}$$

An error metric, denoted ε(k), which may be utilized, for example, for determining an error relating to a received symbol using a Binary Phased Shift Keying (BPSK) modulation, may be defined, for example, as follows:

$$\varepsilon(k) = \begin{cases} \sqrt{(\hat{y}_R(k)-+1)^2+(\hat{y}_I(k)-0)^2} & \text{if } \hat{y}_R(k) \geq 0 \\ \sqrt{(\hat{y}_R(k)--1)^2+(\hat{y}_I(k)-0)^2} & \text{if } \hat{y}_R(k) < 0 \end{cases} \tag{5}$$

Equation 5 may be based, for example, on the assumption that a bit having the value "1" was transmitted if $\hat{y}_R(k) \geq 0$ and a bit having the value "0" was transmitted if $\hat{y}_R(k) < 0$.

The error metric of Equation 5 may be determined, for example, with respect to training sequence symbols, which may be received during a training mode, and/or with respect to any other suitable data symbols.

In some demonstrative embodiments, the feedback output 130 from decoder 128 may include extrinsic soft-decision values $E_A(k)$, $E_B(k)$, $E_{Y1}(k)$ and/or $E_{Y2}(k)$, which may be proportional to the log of the probability that the respective values of A(k), B(k), Y1(k) and/or Y2(k) at the time k are equal to 1.

In some demonstrative embodiments, equalizer 136 may determine the error metric ε(k) based on the extrinsic soft-decision values $E_A(k)$, $E_B(k)$, $E_{Y1}(k)$ and/or $E_{Y2}(k)$.

In some demonstrative embodiments, equalizer 136 may determine the error metric ε(k) by weighting the distances between the received symbol and the possible options of the transmitted symbol according to the extrinsic soft-decision values $E_A(k)$, $E_B(k)$, $E_{Y1}(k)$ and/or $E_{Y2}(k)$. For example, equalizer 136 may determine the error metric ε(k) as follows:

$$\varepsilon = p_1 \times \sqrt{(\hat{y}_R(k)-+1)^2+(\hat{y}_I(k)-0)^2} + p_0 \times \sqrt{(\hat{y}_R(k)--1)^2+(\hat{y}_I(k)-0)^2} \tag{6}$$

wherein $p_1$ and $p_0$ denote weight parameters, which may be assigned with values based on the extrinsic soft-decision values $E_A(k)$, $E_B(k)$, $E_{Y1}(k)$ and/or $E_{Y2}(k)$. For example, the values of $p_1$ and $p_0$ corresponding to a bit, e.g., a soft-decision information bit or a soft-decision parity-bit, may be proportional to the estimated probabilities that at the time k the bit has a value of 1 and 0, respectively.

In some demonstrative embodiments, equalizer 136 may determine the weight parameters $p_1$ and/or $p_0$ based on the extrinsic soft-decision values $E_A(k)$, $E_B(k)$, $E_{Y1}(k)$ and/or $E_{Y2}(k)$, for example, as described below. In other embodiments, equalizer 136 may determine the weight parameters $p_1$ and/or $p_0$ based in any other suitable manner.

In some demonstrative embodiments, equalizer may determine LLR values, denoted $L(a_d(k))$, $L(b_d(k))$, $L(y_1(k))$, and/or $L(y_2(k))$, corresponding to the bits $a_d(k)$, $b_d(k)$, $y_1(k)$ and/or $y_2(k)$, respectively, for example, as follows:

$$L(a_d(k))=EA_{21d}(k)+A(k) \tag{7}$$

$$L(b_d(k))=EB_{21d}(k)+B(k) \tag{8}$$

$$L(y_1(k))=EY_1(k)+Y1(k) \tag{9}$$

$$L(y_2(k))=EY_2(k)+Y2(k) \tag{10}$$

In some demonstrative embodiments, equalizer may determine the parameter values $P_1(a_d(k))$ and/or $P_0(a_d(k))$, corresponding to the bit $a_d(k)$; the parameter values $P_1(b_d(k))$ and/or $P_0(b_d(k))$, corresponding to the bit $b_d(k)$; the parameter values $P_1(y_1(k))$ and/or $P_0(y_1(k))$, corresponding to the bit $y_1(k)$; and/or the parameter values $P_1(y2(k))$ and/or $P_0(y2(k))$, corresponding to the bit y2(k), for example, as follows:

$$p_0(a_d(k))=p(a_d(k)=0)=(1+\exp(L(a_d(k))))^{-1} \tag{11}$$

$$p_1(a_d(k))=p(a_d(k)=1)=1-(1+\exp(L(a_d(k))))^{-1} \tag{12}$$

$$p_0(b_d(k))=p(b_d(k)=0)=(1+\exp(L(b_d(k))))^{-1} \tag{13}$$

$$p_1(b_d(k))=p(b_d(k)=1)=1-(1+\exp(L(b_d(k))))^{-1} \tag{14}$$

$$p_0(y_1(k))=p(y_1(k)=0)=(1+\exp(L(y_1(k))))^{-1} \tag{15}$$

$$p_1(y_1(k))=p(y_1(k)=1)=1-(1+\exp(L(y_1(k))))^{-1} \tag{16}$$

$$p_0(y_2(k))=p(y_2(k)=0)=(1+\exp(L(y_2(k))))^{-1} \tag{17}$$

$$p_1(y_2(k))=p(y_2(k)=1)=1-(1+\exp(L(y_2(k))))^{-1} \tag{18}$$

In some demonstrative embodiments, equalizer 136 may determine the error metric ε(k), e.g., in accordance with Equation 8, by determining the error metric corresponding to a bit of the bits $a_d(k)$, $b_d(k)$, $y_1(k)$ and/or $y_2(k)$ based on the respective parameters $p_1$ and/or $p_0$ corresponding to the bit. For example, equalizer 136 may determine the error metric corresponding to the bit $a_d(k)$, e.g., as follows:

$$\varepsilon_a(k) = p_2(a_d(k)=1) \times \sqrt{(\hat{y}_R(k)-+1)^2+(\hat{y}_I(k)-0)^2} + p_2(a_d(k)=0) \times \sqrt{(\hat{y}_R(k)--1)^2+(\hat{y}_I(k)-0)^2} \tag{19}$$

In some demonstrative embodiments, equalizer 136 may adjust the equalizer filter W based on the error metric, for example, as follows:

$$W(k+1)=W(k)+\mu\hat{y}(k)\varepsilon_a^*(k) \tag{20}$$

wherein W(k) and W(k+1) denote consecutive filter taps, the notation "*" denotes a complex conjugate operation, and μ denotes an equalizer step size.

In some demonstrative embodiments, decoder 128 may provide equalizer 136 with the extrinsic soft-decision values $E_A(k)$, $E_B(k)$, $E_{Y1}(k)$ and/or $E_{Y2}(k)$, e.g., after each decoder iteration. According to these embodiments, equalizer 136 may adjust the equalizer parameters after each decoder iteration. In other embodiments, equalizer 136 may adjust the equalizer parameters after a sequence of a suitable number, denoted L, of decoder iterations, e.g., using the extrinsic soft-decision values $E_A(k)$, $E_B(k)$, $E_{Y1}(k)$ and/or $E_{Y2}(k)$ after the L decoder iterations.

In some demonstrative embodiments, wireless communication devices 102 and/or 110 may also include, for example, one or more of a processor 152, an input unit 158, an output unit 160, a memory unit 154, and a storage unit 156. Wireless communication devices 102 and/or 110 may optionally include other suitable hardware components and/or software components. In some demonstrative embodiments, some or all of the components of each of wireless communication devices 102 and/or 110 may be enclosed in a common housing or packaging, and may be interconnected or operably associated using one or more wired or wireless links. In other embodiments, components of each of wireless communication devices 102 and/or 110 may be distributed among multiple or separate devices.

Processor 152 includes, for example, a Central Processing Unit (CPU), a Digital Signal Processor (DSP), one or more processor cores, a single-core processor, a dual-core processor, a multiple-core processor, a microprocessor, a host processor, a controller, a plurality of processors or controllers, a chip, a microchip, one or more circuits, circuitry, a logic unit, an Integrated Circuit (IC), an Application-Specific IC (ASIC), or any other suitable multi-purpose or specific processor or controller. Processor 152 executes instructions, for example, of an Operating System (OS) of wireless communication devices 102 and/or 110 and/or of one or more suitable applications.

Input unit 158 includes, for example, a keyboard, a keypad, a mouse, a touch-pad, a track-ball, a stylus, a microphone, or other suitable pointing device or input device. Output unit 160 includes, for example, a monitor, a screen, a flat panel display, a Cathode Ray Tube (CRT) display unit, a Liquid Crystal Display (LCD) display unit, a plasma display unit, one or more audio speakers or earphones, or other suitable output devices.

Memory unit 154 includes, for example, a Random Access Memory (RAM), a Read Only Memory (ROM), a Dynamic RAM (DRAM), a Synchronous DRAM (SD-RAM), a flash memory, a volatile memory, a non-volatile memory, a cache memory, a buffer, a short term memory unit, a long term memory unit, or other suitable memory units. Storage unit 156 includes, for example, a hard disk drive, a floppy disk drive, a Compact Disk (CD) drive, a CD-ROM drive, a DVD drive, or other suitable removable or non-removable storage units. Memory unit 154 and/or storage unit 156, for example, may store data processed by wireless communication device 102 and/or 110.

Figure 2:
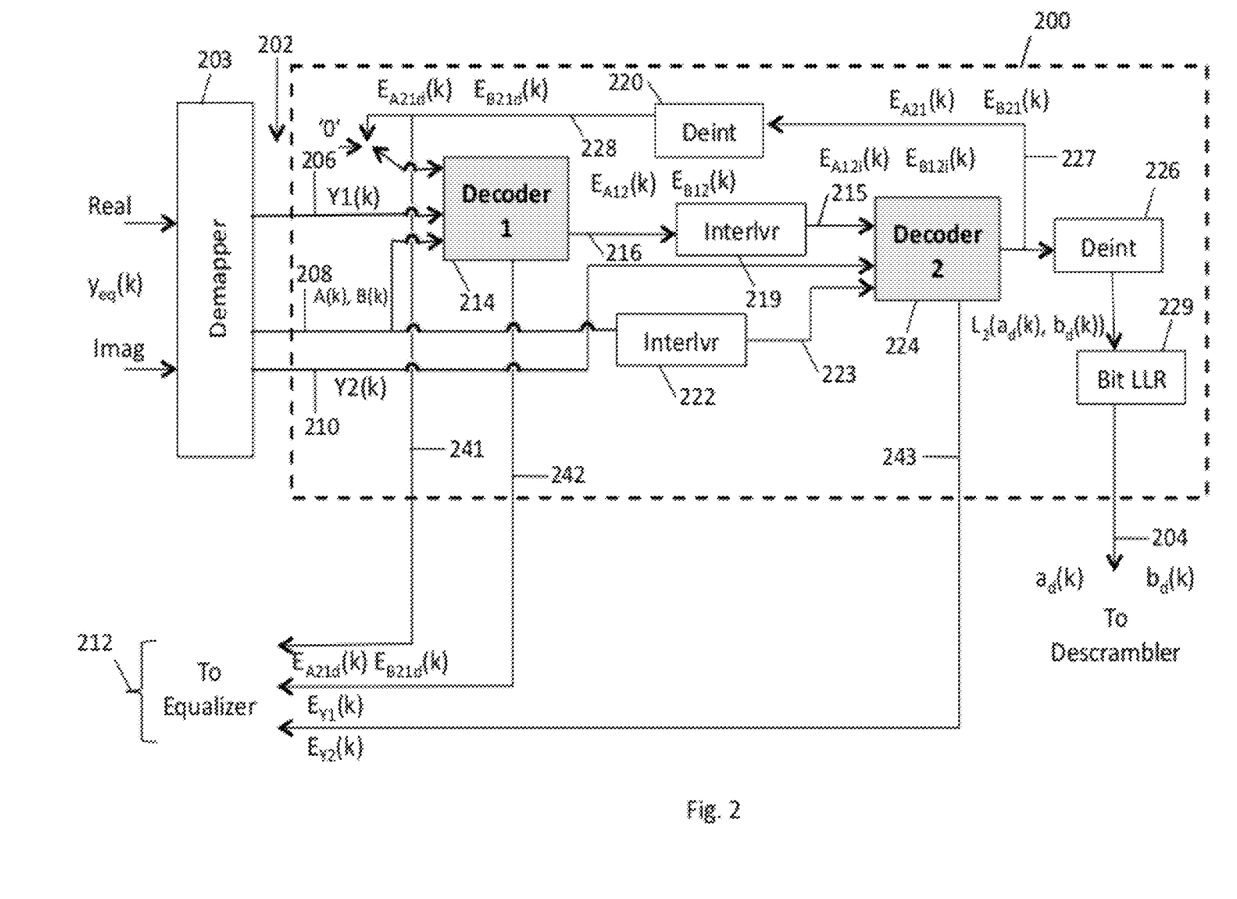
FIG. 2 is a schematic illustration of a decoder, in accordance with some demonstrative embodiments.

Reference is now made to FIG. 2, which schematically illustrates a decoder 200, in accordance with some demonstrative embodiments. In some embodiments, decoder 200 may perform the functionality of turbo decoder 128 (FIG. 1).

In some demonstrative embodiments, decoder 200 may receive an input 202, which may include, for example, a plurality of soft-decision information-bit values 208, e.g., including values A(k) and B(k); a first plurality of soft-decision parity-bit values 206, e.g., including values Y1(k); and a second plurality of soft-decision parity-bit values 210, e.g., including values Y2(k). Decoder may generate an output 204, e.g., including decoded bit values $a_d(k)$ and $b_d(k)$. For example, input 202 may include encoded input 142 (FIG. 1), e.g., received from a demapper 203; and/or output 204 may include output 144 (FIG. 1), e.g., to be provided to descrambler 126 (FIG. 1).

In some demonstrative embodiments, decoder 200 may include any suitable configuration capable of generating output 204 based on input 202, e.g., in accordance with the 802.16 standards, the 3GPP, 3GPP LTE, DVB and/or any other suitable standard, protocol or algorithm.

In some demonstrative embodiments, decoder 200 may utilize a suitable turbo decoder algorithm, for example, a suitable maximum a posteriori (MAP) algorithm, e.g., a suitable Bahl, Cocke, Jelinek and Raviv (BCJR) algorithm, the "log MAP" algorithm, the "max log MAP" algorithm, and the like. The decoder algorithm may include, for example, a plurality of iteration rounds. An iteration round, or a half iteration round of the decoder algorithm may produce an extrinsic soft-decision information-bit value, denoted $E_a(k)$, which may be proportional to the log likelihood of a respective soft-decision information-bit value, $a_k$, e.g., as follows:

$$E_a(k) \sim \log(Pr(a_k=0))  \quad (21)$$

Decoder 200 may iteratively utilize the extrinsic soft-decision information-bit values, e.g., to improve the probability of a correctly decoded bit.

In some demonstrative embodiments, decoder 200 may include two SISO decoders 214 and 224; an interleaver 219 to interleave an output 216 of decoder 214 into an input 215 to be provided to decoder 224, a deinterleaver 220 to deinterleave an output 227 of decoder 224 into an input 228 to be provided to decoder 214; and/or an interleaver 222 to interleave input 208 into input 223 to be provided to decoder 224, e.g., as described below. In other embodiments, decoder 200 may include any other suitable arrangement and/or configuration of SISO decoders, interleavers, deinterleavers, and the like.

Although some embodiments are described herein with reference to a decoder utilizing two SISO decoders, other embodiments may include a decoder utilizing any other suitable configuration and/or number of SISO decoders and/or any other decoders.

In some demonstrative embodiments, decoder 200 may process a block of N symbols by performing I iterations, or 2I rounds. At each time k, Decoder 214 may receive the soft decision information-bits A(k) and B(k) of input 208 and the soft-decision parity-bit Y1(k) of input 206, as well as deinterleaved input 228 including extrinsic soft-decision information-bit values $E_{A21d}(k)$ and $E_{B21d}(k)$, which may be generated based on the output 227 of decoder 224. Based on inputs 228, 206 and 208, decoder 214 may generate output 216 including extrinsic soft-decision information bit values $E_{A12}(k)$ and $E_{B12}(k)$, which may be interleaved by interleaver 219 to generate input 215 including the interleaved extrinsic values $E_{A12i}(k)$ and $E_{B12i}(k)$.

In some demonstrative embodiments, decoder 224 may receive interleaved soft-decision information bit values Ai(k) and Bi(k) from interleaver 222, the soft-decision parity-bit values Y2(k) of input 210, and input 215 including the extrinsic values $E_{A12i}(k)$ and $E_{B12i}(k)$. Based on inputs 215, 210 and 223, decoder 224 may generate output 227 including extrinsic soft-decision information-bit values $E_{A21}(k)$ and $E_{B12}(k)$, which may be deinterleaved by deinterleaver 220 to generate input 228.

In some demonstrative embodiments, decoder 200 may also include a suitable deinterleaver 226 to deinterleave output 227, and a suitable bit generation module 229 to generate output 204 based on the deinterleaved extrinsic soft-decision information bit values $E_{A12}(k)$ and $E_{B12}(k)$.

In some demonstrative embodiments, decoder 200 may generate an output 212 including extrinsic soft-decision bit values corresponding to the soft-decision bit values of input 202, e.g., as described in detail below.

In some demonstrative embodiments, output 212 may include a plurality 242 of extrinsic soft-decision parity-bit values $E_{Y1}(k)$ corresponding to the soft-decision parity-bit values Y1(k); a plurality 243 of extrinsic soft-decision parity-bit values $E_{Y2}(k)$ corresponding to the soft-decision parity-bit values Y2(k); and/or a plurality 241 of extrinsic soft-decision information-bit values corresponding to the soft-decision information-bit values A(k) and/or B(k). For example, soft-decision information-bit values 241 may include the extrinsic soft-decision information-bit values $E_{A21d}(k)$ and $E_{B21d}(k)$.

In some demonstrative embodiments, output 212 may be provided to one or more receiver modules 132 (FIG. 1), e.g., to equalizer 136 (FIG. 1), as described above.

In some demonstrative embodiments, SISO decoder 214 may determine the extrinsic soft-decision parity-bit values 242, based, for example, on the soft-decision parity-bit values Y1(k); and/or SISO decoder 224 may determine the extrinsic soft-decision parity-bit values 243, based, for example, on the soft-decision parity-bit values Y2(k).

In some demonstrative embodiments, SISO decoders 214 and/or 224 may determine extrinsic soft-decision parity-bit values 242 and/or 243, respectively, based on suitable branch metrics (BM), e.g., as described below.

In some demonstrative embodiments, decoders 214 and/or 224 may utilize a plurality of suitable branch metrics, a plurality of suitable forward path metrics and/or a plurality of suitable backward path metrics. For example, decoders 214 and/or 224 may determine eight sets of branch metrics, denoted $BM_{001}(k)$ to $BM_{111}(k)$, based on the soft-decision values A(k), B(k), Y1(k) and/or Y2(k). Decoders 214 and/or 224 may also determine eight forward path metrics, denoted $\alpha_{000}(k)$ to $\alpha_{111}(k)$, and/or eight backwards path metrics, denoted $\beta_{000}(k)$ to $\beta_{111}(k)$.

In some demonstrative embodiments, the branch metrics $BM_{001}(k)$ to $BM_{111}(k)$, forward path metrics $\alpha_{000}(k)$ to $\alpha_{111}(k)$ and/or the backwards path metrics $\beta_{000}(k)$ to $\beta_{111}(k)$ may include the same branch metrics, forward path metrics and/or backwards path metrics, respectively, which may be used by decoders 214 and/or 224 for generating outputs 216 and/or 227, respectively. In other embodiments, one or more of the branch metrics, the forward path metrics and/or the backwards path metrics may include any other suitable metrics.

In some demonstrative embodiments, decoder 214 may calculate a LLR on Y1(k), for example, by calculating the log likelihood, denoted $L_{Y1\_0}(k)$, that the parity bit Y1(k)=0, calculating the log likelihood, denoted $L_{Y1\_1}(k)$, that the parity bit Y1(k)=1, e.g., as described below.

In some demonstrative embodiments, decoder 214 may calculate the log likelihoods $L_{Y1\_0}(k)$ and/or $L_{Y1\_1}(k)$ based on the trellis diagram used for encoding the encoded information bits, e.g., the trellis diagram used by encoder 105 (FIG. 1).

In one example, at time k decoder may determine the log likelihood $L_{Y1\_0}(k)$ using the branches of the trellis diagram corresponding to the bit Y1=0, for example, as follows:

$$L_{Y1\_0} = \max* \begin{pmatrix} \alpha_0 + \beta_0 + BM_{000}, \alpha_0 + \beta_3 + BM_{110} \\ \alpha_1 + \beta_4 + BM_{000}, \alpha_1 + \beta_7 + BM_{110} \\ \alpha_2 + \beta_6 + BM_{010}, \alpha_2 + \beta_5 + BM_{100} \\ \alpha_3 + \beta_2 + BM_{010}, \alpha_3 + \beta_1 + BM_{100} \\ \alpha_4 + \beta_1 + BM_{010}, \alpha_4 + \beta_2 + BM_{100} \\ \alpha_5 + \beta_5 + BM_{010}, \alpha_5 + \beta_6 + BM_{100} \\ \alpha_6 + \beta_7 + BM_{000}, \alpha_6 + \beta_4 + BM_{110} \\ \alpha_7 + \beta_3 + BM_{000}, \alpha_7 + \beta_0 + BM_{110} \end{pmatrix} \quad (22)$$

wherein $\max*(x,y)=\max(x,y)+\ln(e^{-|y-x|})$, e.g., if the log MAP algorithm is utilized. The second term of the calculation of max* may include a correction value, which may be neglected, e.g., if the Max log MAP algorithm, is utilized. Any other suitable calculation of max* may be used, e.g., if another suitable decoder algorithm is utilized.

In one example, at time k decoder may determine the log likelihood $L_{Y1\_1}(k)$ using the branches of the trellis diagram corresponding to the bit Y1=1, for example, as follows:

$$L_{Y1\_1} = \max* \begin{pmatrix} \alpha_0 + \beta_7 + BM_{011}, \alpha_0 + \beta_4 + BM_{101} \\ \alpha_1 + \beta_3 + BM_{011}, \alpha_1 + \beta_0 + BM_{101} \\ \alpha_2 + \beta_1 + BM_{001}, \alpha_2 + \beta_2 + BM_{111} \\ \alpha_3 + \beta_5 + BM_{001}, \alpha_3 + \beta_6 + BM_{111} \\ \alpha_4 + \beta_4 + BM_{001}, \alpha_4 + \beta_5 + BM_{111} \\ \alpha_5 + \beta_2 + BM_{001}, \alpha_5 + \beta_1 + BM_{111} \\ \alpha_6 + \beta_0 + BM_{011}, \alpha_6 + \beta_3 + BM_{101} \\ \alpha_7 + \beta_4 + BM_{011}, \alpha_7 + \beta_7 + BM_{101} \end{pmatrix} \quad (23)$$

In some demonstrative embodiments, decoder 214 may determine the normalized LLR, denoted $L_{Y1}(k)$, corresponding to the parity-bit Y1, for example, by determining the difference between the log likelihoods $L_{Y1\_0}(k)$ and $L_{Y1\_1}(k)$, e.g., as follows:

$$L_{Y1}(k)=L_{Y1\_0}(k)-L_{Y1\_1}(k) \quad (24)$$

In some demonstrative embodiments, decoder 214 may determine the extrinsic soft-decision parity-bit values $\{E_{Y1}(k)\}$ based, for example, on the normalized LLRs $\{L_{Y1}(k)\}$ and the input soft-decision parity bit value $\{Y1(k)\}$, e.g., as follows:

$$E_{Y1}(k)=L_{Y1}(k)-Y1(k) \quad (25)$$

In some demonstrative embodiments, it may be assumed, for example, that the estimates of the soft-decision parity-bit values Y1 improve between iterations, for example, since it may be assumed that the estimates of the soft-decision information bit values A and/or B may improve between iterations, and since the soft-decision parity-bit values Y1 may be linearly dependent upon the soft-decision information bit values A and/or B.

In some demonstrative embodiments, decoder 214 may update one or more of the branch-metrics based on the extrinsic soft-decision parity-bit values $\{E_{Y1}(k)\}$. For example, decoder 214 may store the extrinsic soft-decision parity-bit values, denoted $E_{Y1\_prev}(k)$, of at least one previous iteration round, and may use the stored $E_{Y1\_prev}(k)$ values to adjust the branch metric contributions of the soft-decision parity-bit values Y1 for a current iteration.

In some demonstrative embodiments, decoder 224 may determine the extrinsic soft-decision parity bit values $\{E_{Y2}(k)\}$, for example, in analogy to the calculation of the extrinsic soft-decision parity-bit values $\{E_{Y1}(k)\}$.

Figure 3:
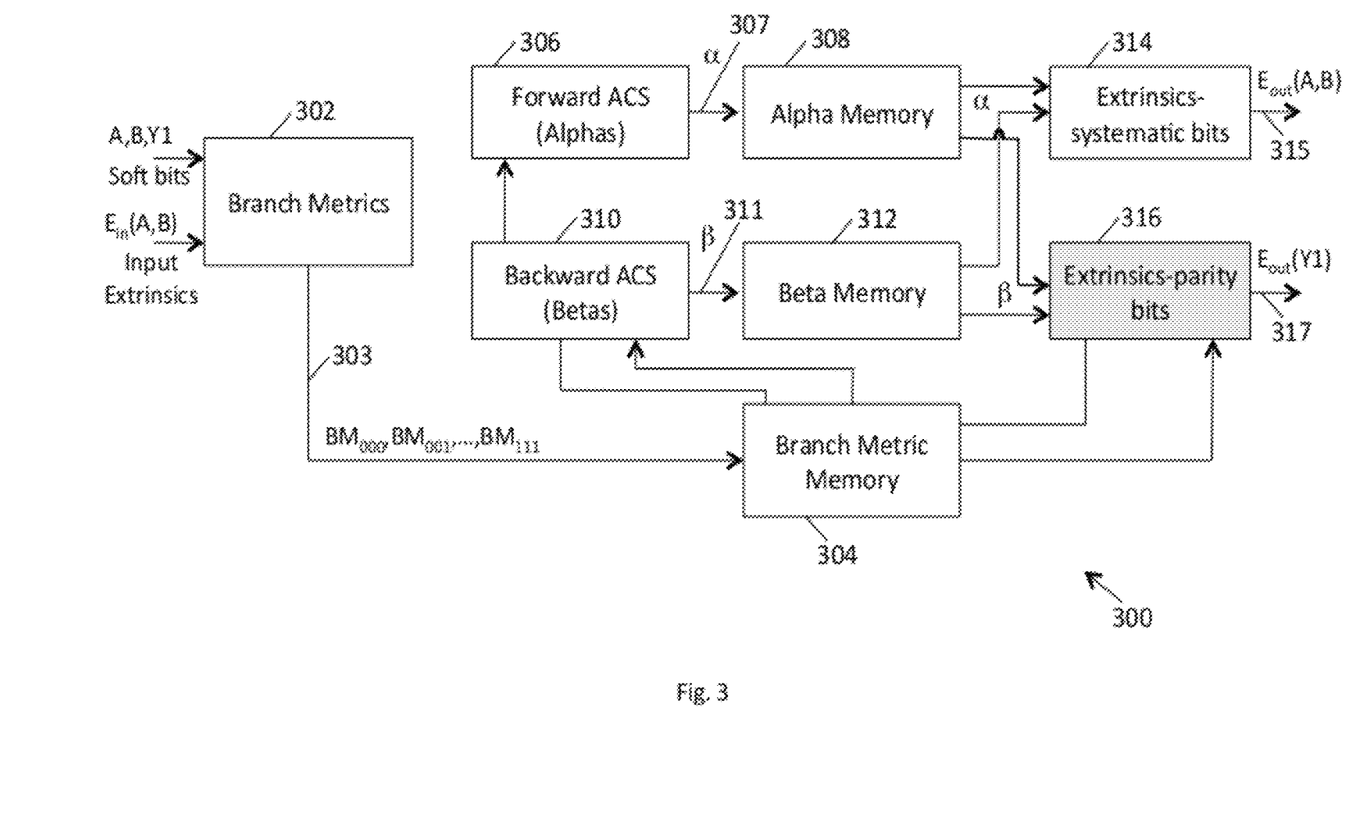
FIG. 3 is a schematic illustration of a soft-input-soft-output decoder, in accordance with some demonstrative embodiments.

Reference is now made to FIG. 3, which schematically illustrates a SISO decoder 300, in accordance with some demonstrative embodiments. In some embodiments, SISO decoder 300 may perform the functionality of SISO decoders 214 and/or 224 (FIG. 2).

In some demonstrative embodiments, SISO decoder 300 may include a branch-metrics generator 302 to generate branch metrics 303. For example, branch-metrics generator 302 may include a suitable generator capable of generating the branch metrics $BM_{001}(k)$ to $BM_{111}(k)$. SISO decoder 300 may also include a branch-metrics memory 304 to store branch-metrics 303.

In some demonstrative embodiments, SISO decoder 300 may include any suitable backwards-path metrics generator 310 to generate backwards-path metrics 311, e.g., the backwards path metrics $\beta_{000}(k)$ to $\beta_{111}(k)$; any suitable backwards-path metrics memory 312 to store backwards-path metrics 311; any suitable forward-path metrics generator 306 to generate forward-path metrics 307, e.g., the forward path metrics $\alpha_{000}(k)$ to $\alpha_{111}(k)$; any suitable forward-path metrics memory 308 to store forward-path metrics 307; and/or any suitable extrinsic information-bit generator 314 to generate extrinsic soft-decision information-bit values, e.g., of outputs 216 and/or 227 (FIG. 2).

In some demonstrative embodiments, SISO decoder 300 may also include an extrinsic soft-decision parity-bit generator 316 to generate an output 317 including extrinsic soft-decision parity-bit values. For example, extrinsic soft-decision parity-bit generator 316 may generate output 317 including extrinsic soft-decision parity-bit values $\{E_{y1}(k)\}$, e.g., if decoder 300 performs the functionality of decoder 214 (FIG. 2); or decision parity-bit values $\{E_{y2}(k)\}$, e.g., if decoder 300 performs the functionality of decoder 224 (FIG. 2).

In some demonstrative embodiments, extrinsic soft-decision parity-bit generator 316 may generate output 317 based on the branch metrics, the backwards path metrics and/or the forward path metrics, for example, based on Equations 22, 23, 24 and/or 25, as described above.

Figure 4:
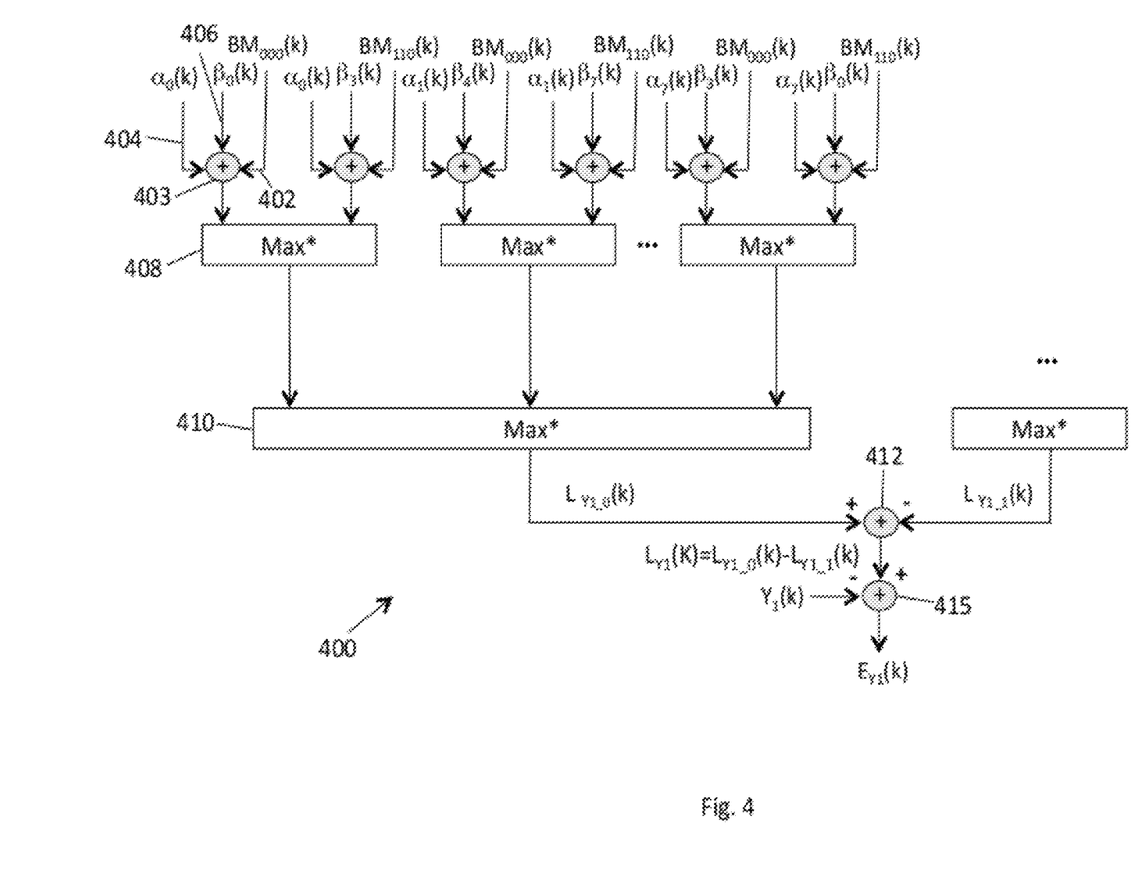
FIG. 4 is a schematic illustration of an extrinsic soft-decision parity-bit generator, in accordance with some demonstrative embodiments.

Reference is now made to FIG. 4, which schematically illustrates an extrinsic soft-decision parity-bit generator 400, in accordance with some demonstrative embodiments. In some embodiments, extrinsic soft-decision parity-bit generator 400 may perform the functionality of extrinsic soft-decision parity-bit generator 316 (FIG. 3).

In some demonstrative embodiments, extrinsic soft-decision parity-bit generator 400 may include a plurality of adders to summarize the branch metrics, the backwards path metrics and/or the forward path metrics, e.g., according to Equations 22 and 23. For example, extrinsic soft-decision parity-bit generator 400 may include thirty-two three-way adders 403. For example, each adder of adders 403 may summarize a branch metric 402, a backwards path metric 406 and a forward path metric 404 of a respective element of Equations 22 and 23.

In some demonstrative embodiments, extrinsic soft-decision parity-bit generator 400 may also include a plurality of two-way max* operators 408 capable of performing the max* operation on two input values, e.g., according to Equations 22 and 23. For example, extrinsic soft-decision parity-bit generator 400 may include sixteen two-may max* operators 408. For example, each max* operator 408 may perform the max* operation with respect to the outputs of two respective adders 403, e.g., corresponding to a respective row of the max* operation of Equations 22 and 23.

In some demonstrative embodiments, extrinsic soft-decision parity-bit generator 400 may also include a plurality of eight-way max* operators 410 capable of performing the max* operation on eight input values, e.g., according to Equations 22 and 23. For example, extrinsic soft-decision parity-bit generator 400 may include two eight-may max* operators 410. For example, each max* operator 410 may perform the max* operation with respect to the outputs of eight respective operators 408, e.g., corresponding to a respective one of Equations 22 and 23. For example, the outputs of the two operators 410 may include the values of the likelihoods $L_{y1\_0}(k)$ and $L_{y1\_1}(k)$, respectively. In some embodiments, eight-way max* operator 410 may be implemented as a tree of 2-way max* operators.

In some demonstrative embodiments, extrinsic soft-decision parity-bit generator 400 may also include a two-way adder 412 capable of summing the outputs of max* operators 410 to generate an output 413 including the value of denoted $L_{y1}(k)$.

Extrinsic soft-decision parity-bit generator 400 may also include an adder 415 to determine the extrinsic soft-decision parity-bit values $\{E_{y1}(k)\}$ based, for example, on the normalized LLRs $\{L_{y1}(k)\}$ and the input soft-decision parity bit value $\{Y1(k)\}$, e.g., in accordance with Equation 25.

Figure 5:
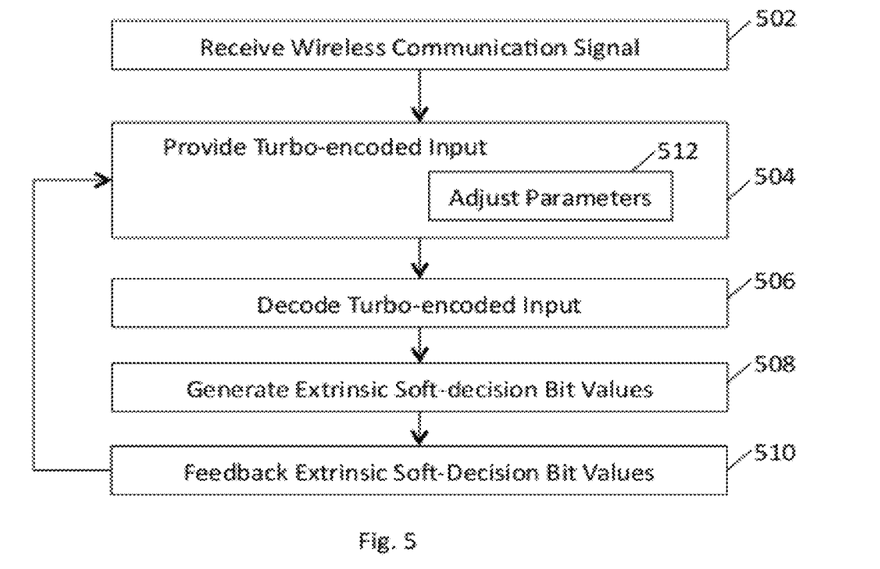
FIG. 5 is a schematic flow-chart illustration of a method of decoding, in accordance with some demonstrative embodiments.

Reference is made to FIG. 5, which schematically illustrates a method of decoding, in accordance with some demonstrative embodiments. In some embodiments, one or more operations of the method of FIG. 5 may be performed by a device, e.g., device 110 (FIG. 1), a receiver, e.g., receiver 112 (FIG. 1) and/or a decoder, e.g., decoder 128 (FIG. 1).

As indicated at block 506, the method may include decoding a turbo-encoded input according to a turbo code. For example, the turbo-encoded input may include a plurality of soft-decision information-bit values and a plurality of soft-decision parity-bit values corresponding to the soft-decision information bit values. For example, turbo decoder 128 (FIG. 1) may decode input 142 (FIG. 1), e.g., as described above.

As indicated at block 508, the method may include generating at least one output of a plurality of extrinsic soft-decision values corresponding to the to the turbo-encoded input. For example, the extrinsic soft-decision values may include extrinsic soft-decision parity-bit values corresponding to the input soft-decision parity-bit values; and/or extrinsic soft-decision information-bit values corresponding to the input soft-decision information-bit values, e.g., as described above.

In some demonstrative embodiments, the method may include providing the turbo-encoded inputs, as indicated at block 504. For example, the method may include receiving a wireless communication signal, as indicated at block 502, and providing the turbo-encoded input based on the received wireless communication signal. For example, one or more receiver modules 132 (FIG. 1) may receive a wireless communication signal via antennas 114 (FIG. 1) and/or generate turbo-encoded input 142 (FIG. 1), e.g., as described above.

As indicated at block 510, the method may include feeding back the extrinsic soft-decision values.

As indicated at block 512, the method may include adjusting one or more parameters based on the extrinsic soft-decision values. For example, decoder 128 may feedback the extrinsic soft-decision values to equalizer 136 (FIG. 1), and equalizer 136 (FIG. 1) may adjust one or more equalizer parameters based on the feedback extrinsic soft-decision values, e.g., as described above.

Figure 6:
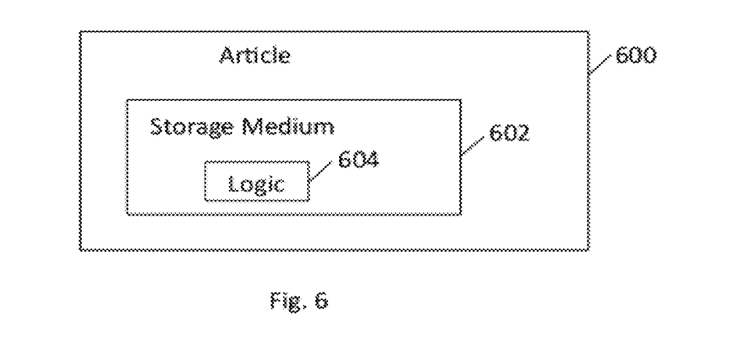
FIG. 6 is a schematic illustration of an article of manufacture, in accordance with some demonstrative embodiments.

Reference is made to FIG. 6, which schematically illustrates an article of manufacture 600, in accordance with some demonstrative embodiments. Article 600 may include a machine-readable storage medium 602 to store logic 604, which may be used, for example, to perform at least part of the functionality of receiver 112 (FIG. 1) and/or to perform one or more operations of the method of FIG. 5.

In some demonstrative embodiments, article 600 and/or machine-readable storage medium 602 may include one or more types of computer-readable storage media capable of storing data, including volatile memory, non-volatile memory, removable or non-removable memory, erasable or non-erasable memory, writeable or re-writeable memory, and the like. For example, machine-readable storage medium 602 may include, RAM, DRAM, Double-Data-Rate DRAM (DDR-DRAM), SDRAM, static RAM (SRAM), ROM, programmable ROM (PROM), erasable programmable ROM (EPROM), electrically erasable programmable ROM (EEPROM), Compact Disk ROM (CD-ROM), Compact Disk Recordable (CD-R), Compact Disk Rewriteable (CD-RW), flash memory (e.g., NOR or NAND flash memory), content addressable memory (CAM), polymer memory, phase-change memory, ferroelectric memory, silicon-oxide-nitride-oxide-silicon (SONOS) memory, a disk, a floppy disk, a hard drive, an optical disk, a magnetic disk, a card, a magnetic card, an optical card, a tape, a cassette, and the like. The computer-readable storage media may include any suitable media involved with downloading or transferring a computer program from a remote computer to a requesting computer carried by data signals embodied in a carrier wave or other propagation medium through a communication link, e.g., a modem, radio or network connection.

In some demonstrative embodiments, logic 604 may include instructions, data, and/or code, which, if executed by a machine, may cause the machine to perform a method, process and/or operations as described herein. The machine may include, for example, any suitable processing platform, computing platform, computing device, processing device, computing system, processing system, computer, processor, or the like, and may be implemented using any suitable combination of hardware, software, firmware, and the like.

In some demonstrative embodiments, logic 604 may include, or may be implemented as, software, a software module, an application, a program, a subroutine, instructions, an instruction set, computing code, words, values, symbols, and the like. The instructions may include any suitable type of code, such as source code, compiled code, interpreted code, executable code, static code, dynamic code, and the like. The instructions may be implemented according to a predefined computer language, manner or syntax, for instructing a processor to perform a certain function. The instructions may be implemented using any suitable high-level, low-level, object-oriented, visual, compiled and/or interpreted programming language, such as C, C++, Java, BASIC, Matlab, Pascal, Visual BASIC, assembly language, machine code, and the like.

Functions, operations, components and/or features described herein with reference to one or more embodiments, may be combined with, or may be utilized in combination with, one or more other functions, operations, components and/or features described herein with reference to one or more other embodiments, or vice versa.

While certain features of the invention have been illustrated and described herein, many modifications, substitutions, changes, and equivalents may occur to those skilled in the art. It is, therefore, to be understood that the appended claims are intended to cover all such modifications and changes as fall within the true spirit of the invention.

What is claimed is:

1. A device comprising:
   a turbo decoder to decode a turbo-encoded input according to a turbo code, the turbo-encoded input including a plurality of soft-decision information-bit values and first and second pluralities of soft-decision parity-bit values corresponding to the soft-decision information bit values,
   wherein the turbo decoder is to output first and second pluralities of extrinsic soft-decision parity-bit values corresponding to the first and second pluralities of soft-decision parity-bit values,
   wherein said turbo decoder comprises first and second soft-input-soft-output (SISO) decoders to decode the turbo-encoded input using the first and second pluralities of soft-decision parity-bit values,
   wherein the first SISO decoder is configured to generate the first plurality of extrinsic soft-decision parity-bit values based at least on said plurality of soft-decision information-bit values, said first plurality of soft-decision parity-bit values and a plurality of extrinsic soft-decision information-bit values corresponding to the plurality of soft-decision information-bit values,
   and wherein the second SISO decoder is configured to generate the second plurality of extrinsic soft-decision parity-bit values based at least on said plurality of soft-decision information-bit values, and said second plurality of soft-decision parity-bit values.

2. The device of claim 1, wherein the turbo-encoded input corresponds to an output of a receiver module, and wherein the turbo decoder is to provide at least one of the first and second pluralities of extrinsic parity-bit values as feedback to the receiver module.

3. The device of claim 2, wherein the turbo decoder is to feedback to the receiver module the plurality of extrinsic soft-decision information-bit values.

4. The device of claim 1, wherein the second SISO decoder is to determine a plurality of branch-metrics based at least on the plurality of soft-decision information-bit values and the second plurality of soft-decision parity-bit values, and wherein the second SISO decoder is to determine the second plurality of extrinsic soft-decision parity-bit values based on the branch metrics.

5. The device of claim 4, wherein the second SISO decoder is to update one or more of the branch-metrics based on the second plurality of extrinsic soft-decision parity-bit values.

6. The device of claim 1, wherein the first SISO decoder is to determine a plurality of branch-metrics based on the plurality of soft-decision information-bit values, the first plurality of soft-decision parity-bit values, and the extrinsic soft-decision information-bit values, and wherein the first SISO decoder is to determine the first plurality of extrinsic soft-decision parity-bit values based on the branch metrics.

7. The device of claim 6, wherein the first SISO decoder is to update one or more of the branch-metrics based on the first plurality of extrinsic soft-decision parity-bit values.

8. The device of claim 1, wherein an extrinsic soft-decision parity-bit value of the first and second pluralities of extrinsic soft-decision parity-bit values is proportional to a probability that a respective soft-decision parity-bit value of the first and second pluralities of soft-decision parity-bit values has a predefined value.

9. The device of claim 8, wherein the extrinsic soft-decision parity-bit value is based on a log-likelihood-ratio value corresponding to the respective soft-decision parity-bit value.

10. A wireless communication system comprising:
    one or more antennas; and
    a receiver to receive a wireless communication transmission encoded according to a turbo code, the receiver comprising:
    an equalizer to generate an equalized output based on the received transmission; and
    a turbo decoder to decode a turbo-encoded input corresponding to the equalized output, and to provide the equalizer with a feedback including extrinsic values corresponding to the turbo-encoded input,
    wherein the turbo-encoded input includes a plurality of soft-decision information-bit values and first and second pluralities of soft-decision parity-bit values corresponding to the soft-decision information bit values, and the feedback includes first and second pluralities of extrinsic soft-decision parity-bit values corresponding to the first and second pluralities of soft-decision parity-bit values,
    and wherein said turbo decoder comprises first and second soft-input-soft-output (SISO) decoders to decode the turbo-encoded input using the first and second pluralities of soft-decision parity-bit values, the first SISO decoder is configured to generate the first plurality of extrinsic soft-decision parity-bit values based at least on said plurality of soft-decision information-bit values, said first plurality of soft-decision parity-bit values and a plurality of extrinsic soft-decision information-bit values corresponding to the plurality of soft-decision information-bit values, and the second SISO decoder is configured to generate the second plurality of extrinsic soft-decision parity-bit values based at least on said plurality of soft-decision information-bit values, and said second plurality of soft-decision parity-bit values.

11. The system of claim 10, wherein the equalizer is to adjust one or more equalizer parameters based on the feedback.

12. The system of claim 10, wherein the first SISO decoder is to determine a plurality of branch-metrics based on the plurality of soft-decision information-bit values, the first plurality of soft-decision parity-bit values, and the extrinsic soft-decision information-bit values, and wherein the first SISO decoder is to determine the first plurality of extrinsic soft-decision parity-bit values based on the branch metrics.

13. The system of claim 10, wherein the second SISO decoder is to determine a plurality of branch-metrics based at least on the plurality of soft-decision information-bit values and the second plurality of soft-decision parity-bit values, and wherein the second SISO decoder is to determine the second plurality of extrinsic soft-decision parity-bit values based on the branch metrics.

14. The system of claim 10, wherein an extrinsic soft-decision parity-bit value of the first and second pluralities of extrinsic soft-decision parity-bit values is proportional to a probability that a respective soft-decision parity-bit value of the first and second pluralities of soft-decision parity-bit values has a predefined value.

15. A method comprising:
  decoding a turbo-encoded input received from a receiver module, the turbo-encoded input includes a plurality of soft-decision information-bit values and first and second pluralities of soft-decision parity-bit values corresponding to the soft-decision information bit values; and
  feeding back to the receiver module a plurality of extrinsic soft-decision bit values corresponding to the turbo-encoded input, the feedback includes first and second pluralities of extrinsic soft-decision parity-bit values corresponding to the first and second pluralities of soft-decision parity-bit values,
  wherein the decoding includes using first and second soft-input-soft-output (SISO) decoders to decode the turbo-encoded input using the first and second pluralities of soft-decision parity-bit values, the first SISO decoder is configured to generate the first plurality of extrinsic soft-decision parity-bit values based at least on said plurality of soft-decision information-bit values, said first plurality of soft-decision parity-bit values and a plurality of extrinsic soft-decision information-bit values corresponding to the plurality of soft-decision information-bit values, and the second SISO decoder is configured to generate the second plurality of extrinsic soft-decision parity-bit values based at least on said plurality of soft-decision information-bit values, and said second plurality of soft-decision parity-bit values.

16. The method of claim 15, wherein the decoding includes using the first SISO decoder to determine a plurality of branch-metrics based on the plurality of soft-decision information-bit values, the first plurality of soft-decision parity-bit values, and the extrinsic soft-decision information-bit values, and to determine the first plurality of extrinsic soft-decision parity-bit values based on the branch metric.

17. The method of claim 16, comprising updating one or more of the branch-metrics based on the first plurality of extrinsic soft-decision parity-bit values.

18. The method of claim 15, wherein the decoding includes using the second SISO decoder to determine a plurality of branch-metrics based at least on the plurality of soft-decision information-bit values and the second plurality of soft-decision parity-bit values, and to determine the second plurality of extrinsic soft-decision parity-bit values based on the branch metrics.

* * * * *

UNITED STATES PATENT AND TRADEMARK OFFICE
CERTIFICATE OF CORRECTION

PATENT NO. : 8,365,051 B2
APPLICATION NO. : 12/773050
DATED : January 29, 2013
INVENTOR(S) : Anthony L. Chun et al.

It is certified that error appears in the above-identified patent and that said Letters Patent is hereby corrected as shown below:

In column 18, line 26, in claim 16, delete "metric." and insert -- metrics. --, therefor.

Signed and Sealed this
Ninth Day of April, 2013

Teresa Stanek Rea
*Acting Director of the United States Patent and Trademark Office*